US012720712B2

(12) United States Patent
Summerville et al.

(10) Patent No.: US 12,720,712 B2
(45) Date of Patent: Aug. 25, 2026

(54) LIQUID METAL BASED THERMAL INTERFACE MATERIAL

(71) Applicant: Lenovo (Singapore) Pte. Ltd., Singapore (SG)

(72) Inventors: Mark Summerville, Morrisville, NC (US); Thomas Annunziata, Morrisville, NC (US); Justin Ringuette, Morrisville, NC (US); Mark Heidenfeldt, Morrisville, NC (US); Sandy Collins, Morrisville, NC (US)

(73) Assignee: Lenovo (Singapore) Pte. Ltd., Singapore (SG)

( * ) Notice: Subject to any disclaimer, the term of this patent is extended or adjusted under 35 U.S.C. 154(b) by 277 days.

(21) Appl. No.: 18/589,844

(22) Filed: Feb. 28, 2024

(65) Prior Publication Data

US 2025/0275099 A1 Aug. 28, 2025

(51) Int. Cl.
*H05K 7/20* (2006.01)

(52) U.S. Cl.
CPC ................................ *H05K 7/20481* (2013.01)

(58) Field of Classification Search
CPC . H10W 90/00; H10W 90/724; H10W 90/734; H10W 90/754; H10W 90/756; H10W 74/00; H10W 72/0198; H10W 72/884; H10W 72/952; H05K 7/20481; G06F 1/20
See application file for complete search history.

(56) References Cited

U.S. PATENT DOCUMENTS

| | | | | |
|---|---|---|---|---|
| 10,937,716 | B2 * | 3/2021 | Rykaczewski | H01L 23/3735 |
| 2004/0212963 | A1 * | 10/2004 | Unrein | H01L 23/4006 257/E23.084 |
| 2006/0120051 | A1 * | 6/2006 | Macris | H01L 23/42 257/E23.137 |
| 2012/0043668 | A1 * | 2/2012 | Refai-Ahmed | H01L 23/04 438/109 |
| 2014/0175495 | A1 * | 6/2014 | Chuang | H10H 20/018 438/22 |
| 2021/0249322 | A1 * | 8/2021 | Lin | H01L 23/367 |
| 2023/0141412 | A1 * | 5/2023 | Kim | H05K 1/115 174/262 |
| 2024/0006393 | A1 * | 1/2024 | Kweon | H01L 23/433 |
| 2024/0038627 | A1 * | 2/2024 | Hung | H01L 23/3733 |
| 2024/0047301 | A1 * | 2/2024 | Lee | H01L 23/3736 |

(Continued)

OTHER PUBLICATIONS

Extended European Search Report issued in corresponding European Patent Application No. 25156460.5, dated Aug. 25, 2025 (9 pages).

*Primary Examiner* — Amir A Jalali
(74) *Attorney, Agent, or Firm* — Osha Bergman Watanabe & Burton LLP

(57) ABSTRACT

A multilayer thermal interface material includes: a first metal layer comprising a first metal; a second metal layer comprising a second metal; and an interposed layer disposed between the first metal layer and the second metal layer. The first metal layer, the second metal layer, and the interposed layer are in a solid state at or below a first temperature. The interposed layer is configured to change phase based on temperature and is in a phase other than a solid state at a second temperature, such that the first metal layer and the second metal layer contact each other.

18 Claims, 2 Drawing Sheets

(56) References Cited

U.S. PATENT DOCUMENTS

2024/0079366 A1* 3/2024 Lee .......................... H01L 23/36
2024/0429116 A1* 12/2024 Hong .................. H01L 25/0655
2025/0087549 A1* 3/2025 Jeon ...................... H10W 40/22
2025/0105086 A1* 3/2025 Lan ..................... H01L 23/3675

* cited by examiner

100

| Second Metal Layer | 202 |
| --- | --- |
| Interposed Layer | 211 |
| First Metal Layer | 201 |

100

| Third Metal Layer | 303 |
| --- | --- |
| Second Interposed Layer | 312 |
| Second Metal Layer | 302 |
| First Interposed Layer | 311 |
| First Metal Layer | 301 |

LIQUID METAL BASED THERMAL INTERFACE MATERIAL

BACKGROUND

Heat exchange is critical for any computing system with electronic devices which can generate heat at a level comparable to a bright incandescent light bulb and damage the components within the electronic devices as well as their surroundings. A cooling device is commonly used to direct heat to specific areas where the heat can be safely and efficiently dissipated. However, there is a need for efficient thermal transfer between the electronic device and the cooling device.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

Other aspects and advantages of the claimed subject matter will be apparent from the following description and the appended claims.

DETAILED DESCRIPTION

Figures 1, 2, 3:
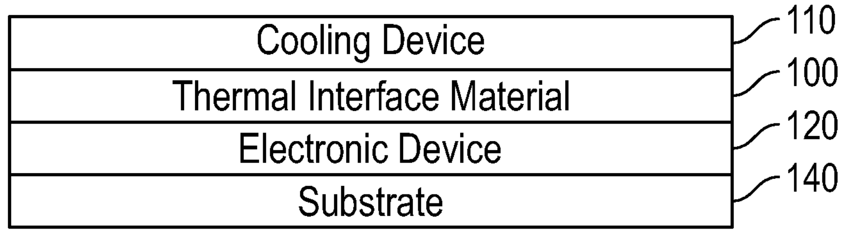
FIG. 1 shows a computing system in accordance with one or more embodiments of the present disclosure.
FIG. 2 shows a thermal interface material in accordance with one or more embodiments of the present disclosure.
FIG. 3 shows a thermal interface material in accordance with one or more embodiments of the present disclosure.

In the following detailed description of embodiments of the present disclosure, numerous specific details are set forth to provide a more thorough understanding of the invention. However, it will be apparent to one of ordinary skill in the art that the invention may be practiced without these specific details. In other instances, well-known features have not been described in detail to avoid unnecessarily complicating the description.

Various embodiments of the present disclosure provide systems and methods related to a liquid metal based thermal interface material. Specific embodiments of the present disclosure will now be described in detail below with reference to the accompanying drawings. Like elements in the various figures are denoted by like reference numerals for consistency.

Turning now to the figures, FIG. 1 shows a computing system 10 in accordance with one or more embodiments of the present disclosure. The computing system 10 comprises a cooling device 110, an electronic device 120, and a thermal interface material 100 disposed between the cooling device 110 and the electronic device 120.

The computing system 10 is intended to encompass any computing system such as a server, desktop computer, laptop/notebook computer, wireless data port, smart phone, personal data assistant (PDA), tablet computing device, one or more processors within these devices, or any other suitable processing device, including both physical or virtual instances (or both) of the computing system. The computing system 10 can serve in a role as a client, network component, a server, a database or other persistency, or any other component (or a combination of roles) of a computer for performing the subject matter described in the present disclosure. The computing system 10 may be communicatively coupled with a network, internally or externally. In some implementations, one or more components of the computing system 10 may be configured to operate within environments, including cloud-computing-based, local, global, or other environment (or a combination of environments). At a high level, the computing system 10 is a device operable to receive, transmit, process, store, or manage data and information associated with the described subject matter. Non-limiting examples of the computing system may include personal computers of all sizes and shapes, such as desktop computers, laptop computers, netbook computers, tablets, web browsers, e-book readers, remote terminals, kiosks, and video game machines, and personal digital assistants (PDAs).

The cooling device 110 may be any type of air or liquid cooling device known in the art, such as an air-cooled fin assembly, a liquid-cooled assembly, a heat pipe assembly, a vapor chamber, etc. In one or more embodiments, the cooling device 110 includes a combination of heat pipes and fans (not shown). The heat pipes may transfer heat away from the electronic device 120 that generates heat, utilizing the principles of phase change and capillary action. The heat pipes may be thin and sealed tubes made of a metal, such as copper or aluminum. The heat pipes may contain a small amount of liquid, in particular, a low-boiling point liquid such as water or refrigerant. When heat is applied to one end of the heat pipe closer to the electronic device 120, the liquid inside may vaporize and travel to the other end of the heat pipe that is away from the electronic device 120, where the vapor releases heat and condenses back into liquid. Such a cyclical process efficiently transfers heat away from the electronic device 120 that generates heat when operating. The heat pipes may be connected to finned structures or heat sinks, which provide a larger surface area for dissipating heat. Fans may be strategically placed to enhance the cooling process by expelling hot air and drawing cool air into the computing system. In one or more embodiments, as the heat pipes transfer heat away from the electronic devices, fans help dissipate this heat by blowing air over the heat sink attached to the heat pipes.

The electronic device 120 refers to any electronic device that may generate heat during operation. In one or more embodiments, the electronic device 120 includes a central processing unit (CPU), which is a primary processor of the computing system, configured to execute instructions and manipulate data to perform the operations of the computing system and any algorithms, methods, functions, processes, flows, and procedures. In one or more embodiments, the electronic device 120 includes a graphics processing unit (GPU), configured to handle graphics rendering and accelerate computations related to visual output, as well as non-graphic calculations, such as calculations involving parallel processing and training of neural networks.

While CPU and GPU are listed as non-limiting examples of the electronic device 120, one having ordinary skill in the art would recognize that the present disclosure is not intended to be limiting. The electronic device 120 is intended to encompass any electronic device that may generate heat, for example, memory such as random access memory (RAM), power management device, transistors and regulators, light emitting diode (LED) assembly, chipset that controls the communication and performance of motherboard and its components, basic input/output system (BIOS) or unified extensible firmware interface (UEFI) firmware, and networking and audio components.

The computing system 10 may include a substrate 140 that accommodates and provides structural support to the electronic devices. In one or more embodiments, the substrate 140 may be a multi-layered printed circuit board (PCB) that provides a foundation for mounting and connecting various components of the electronic devices 120, as well as providing electronic connections between the electronic devices 120 and other parts of the computing system 10, such as memory, power management devices, and peripherals. The substrate 140 may include layers of fiberglass or other materials with copper traces and other metal layers. The copper traces form the pathways for electrical signals. The substrate 140 may include pads or pins for connection to a motherboard or other parts of the computing system.

As shown in FIG. 1, the computing system 10 comprises a thermal interface material 100 disposed between opposite surfaces of the cooling device 110 and the electronic device 120, configured to enhance thermal conductivity between the two surfaces. The thermal interface material 100 is in direct contact with both a surface (for example, a bottom surface) of the cooling device 110 and a surface (for example, a top surface) of the electronic device 120.

Conventionally used thermal interface materials include thermal paste or thermal grease that contains a non-curing polymer and thermally conductive filler particles composed of aluminum oxide, zinc oxide, boron nitride, or aluminum nitride. On the other hand, one or more embodiments of the present disclosure provide a liquid metal based thermal interface material for ease of use and transportation, as well as improved cooling performance compared to conventional non-metallic materials. Liquid metal refers to a metal or a mixture of metals that exists in a liquid state at certain temperatures and has a lower melting point than that of other metals. The liquid metal may comprise one or more of gallium (Ga), indium (In), tin (Sn), bismuth (Bi), antimony (Sb), thallium (Tl), and lead (Pb).

The thermal interface material according to one or more embodiments of the present disclosure may include a plurality of layers and may have a configuration shown in FIGS. 2 and 3.

FIG. 2 shows a multilayer thermal interface material 100 in accordance with one or more embodiments of the present disclosure. The three-layer thermal interface material 100 may include a first metal layer 201 comprising a first metal and a second metal layer 202 comprising a second metal. Each of the first metal and the second metal refer to one or more metals selected from gallium (Ga), indium (In), tin (Sn), bismuth (Bi), antimony (Sb), thallium (Tl), and lead (Pb). For example, the first metal may be Ga, and the second metal may be In, or Sn, or a mixture of In and Sn. Each of the metal layers may be prepared using any known method in the art, such as rolling, physical or chemical depositions, and electroplating or electroless plating.

The first metal layer 201 may comprise at least 80 weight percentage (wt %) of the first metal. In one or more embodiments, the first metal layer 201 comprises at least 85 wt %, or at least 90 wt %, or at least 95 wt % of the first metal. In one or more embodiments, the first metal layer 201 comprises at least 80 wt % of Ga.

The second metal layer 202 may comprise at least 80 wt % of the second metal. In one or more embodiments, the second metal layer 202 comprises at least 85 wt %, or at least 90 wt %, or at least 95 wt % of the second metal. In one or more embodiments, the second metal layer 202 comprises at least 80 wt % of In, or at least 80 wt % of Sn, or at least 80 wt % of In and Sn.

The thermal interface material 100 may include an interposed layer 211 disposed between and in direct contact with the first metal layer 201 and the second metal layer 202. The interposed layer 211 may be composed of a material that is sensitive to temperature, for example, changes phase based on temperature. In one or more embodiments, the interposed layer may be composed of a material that is an organic compound, for example, hydrocarbons or functioned hydrocarbons. The material of the interposed layer may include alkyl chains and/or aromatic compounds. The material of the interposed layer may contain unsaturated bonds and/or various functional groups. The material of the interposed layer may have a melting point that is within the operating temperature of the electronic devices.

At or below a first temperature, the first metal layer 201, the second metal layer 202, and the interposed layer 211 are all in solid state, and the interposed layer 211 is configured to isolate the first metal layer 201 and the second metal layer 202. The interposed layer may have an area that is equal to or larger than those of the first metal layer and the second metal layer. The interposed layer 211 is configured to change phase based on temperature. When a temperature of the thermal interface material 100 increases to a second temperature or above, the interposed layer 211 changes to a phase other than a solid state, such that the first metal layer 201 and second metal layer 202 are in direct contact each other.

According to one or more embodiments shown in FIGS. 1 and 2, a heat may be generated from the electronic devices 120 during operation of the electronic devices 120, causing the temperature of the thermal interface material 100 to increase from the first temperature or below to the second temperature or above. Under the heat, the interposed layer 211 changes phase from a solid state into a state other than the solid state. As a result, the first metal layer 201 and the second metal layer 202 becomes in contact with each other, and metal atoms start diffusing into each other, forming an alloy. Upon contacting and diffusing, melting of the first metal layer 201 and the second metal layer 202 may occur because a melting point of alloy is usually lower than those of individual first metal and second metal. The alloy may comprise at least the first metal and the second metal, and is in a liquid state at or above the second temperature. Once the alloy is formed, it may remain in liquid state even when the temperature decreases below the second temperature. For example, the alloy may remain in liquid state at or above the first temperature.

In one or more embodiments, the first temperature is lower than a melting point of the first metal, a melting point of the second metal, and a melting point of the material of the interposed layer. The first temperature may be within a range of from about 15° C. to from about 28° C., or from about 20° C. to about 25° C. The second temperature may be any temperature that is within a range of operating temperature for electronic device, that is, from room temperature to an increased temperature caused by a heat generated by the electronic device.

In one or more embodiments, the thermal interface material 100 may be disposed between opposite surfaces of the cooling device 110 and the electronic device 120, such that the first metal layer 201 is in direct contact with the electronic device 120, and the second metal layer 202 is in direct contact with the cooling device 110. In other embodiments, the thermal interface material 100 may be disposed between opposite surfaces of the cooling device 110 and the electronic device 120, such that the first metal layer 201 is in direct contact with the cooling device 110, and the second metal layer 202 is in direct contact with electronic device 120.

FIG. 3 shows a multilayer thermal interface material 100 in accordance with one or more embodiments of the present disclosure. The five-layer thermal interface material 100 shown in FIG. 3 includes a first metal layer 301 comprising a first metal, a second metal layer 302 comprising a second metal, and a third metal layer 303 comprising the first metal. Each of the first metal and the second metal refer to one or more metals selected from gallium (Ga), indium (In), tin (Sn), bismuth (Bi), antimony (Sb), thallium (Tl), and lead (Pb). For example, the first metal may be Ga, and the second metal may be In, or Sn, or a mixture of In and Sn. Each of the metal layers may be prepared using any known method in the art, such as rolling, physical or chemical depositions, and electroplating or electroless plating.

Each of the first metal layer 301 and the third metal layer 303 may comprise at least 80 wt % of the first metal. In one or more embodiments, each of the first metal layer 301 and the third metal layer 303 comprise at least 85 wt %, or at least 90 wt %, or at least 95 wt % of the first metal. The weight percentage of the first metal in the first metal layer may be the same with or may be different from the weight percentage of the first metal in the third metal layer. In one or more embodiments, each of the first metal layer 301 and the third metal layer 303 comprises at least 80 wt % of Ga.

The second metal layer 302 may comprise at least 80 wt % of the second metal. In one or more embodiments, the second metal layer 302 comprises at least 85 wt %, or at least 90 wt %, or at least 95 wt % of the second metal. In one or more embodiments, the second metal layer 302 comprises at least 80 wt % of In, or at least 80 wt % of Sn, or at least 80 wt % of In and Sn.

The thermal interface material 100 may include a first interposed layer 311 disposed between and in direct contact with the first metal layer 301 and the second metal layer 302, and a second interposed layer 312, disposed between and in direct contact with the second metal layer 302 and the third metal layer 303. The first interposed layer 311 and the second interposed layer 312 may be composed of a material that is sensitive to temperature, for example, changes phase based on temperature. In one or more embodiments, the material may be an organic compound, for example, hydrocarbons or functioned hydrocarbons. The material may include alkyl chains and/or aromatic compounds. The material may contain unsaturated bonds and/or various functional groups, such as fatty acids, primary and secondary alcohols, ketones, aldehydes, and esters. The material may have a melting point that is within the operating temperature of electronic devices. The first interposed layer 311 and the second interposed layer 312 may be composed of same or different materials.

At or below a first temperature, the first metal layer 301, the second metal layer 302, the third metal layer 303, the first interposed layer 311, and the second interposed layer 312 are all in solid state. The first interposed layer 311 is configured to isolate the first metal layer 301 and the second metal layer 302 at or below the first temperature. The second interposed layer 312 is configured to isolate the second metal layer 302 and the third metal layer 303 at or below the first temperature. Each of the first interposed layer and the second interposed layer may have an area that is equal to or larger than those of the first metal layer and the second metal layer.

The first interposed layer 311 and the second interposed layer 312 are configured to change phase based on temperature. When a temperature of the thermal interface material 100 increase to a second temperature or above, the first interposed layer 311 changes to a phase other than a solid state, such that the first metal layer 301 and second metal layer 302 contact each other, and the second metal layer 302 and the third metal layer 303 contact each other.

According to one or more embodiments shown in FIGS. 1 and 3, a heat may be generated from the electronic devices 120 during operation of the electronic devices 120, causing the temperature of the thermal interface material 100 to increase from the first temperature or below to the second temperature or above. Under the heat, the first interposed layer 311 and the second interposed layer 312 change phase from a solid state into a state other than the solid state. As a result, the first metal layer 301 and the second metal layer 302 becomes in contact with each other, the second metal layer 302 and the third metal layer 303 becomes in contact with each other, and metal atoms may start diffusing into each other. Upon contacting and diffusing, melting of the first metal layer 301 with the second metal layer 302 and the third metal layer 303 may occur because a melting point of alloy is usually lower than those of individual first metal and second metal. The alloy may comprise at least the first metal and the second metal, and is in a liquid state at or above the second temperature. Once the alloy is formed, it may remain in liquid state even when the temperature decreases below the second temperature. For example, the alloy may remain in liquid state at or above the first temperature.

In one or more embodiments, the thermal interface material 100 may be disposed between opposite surfaces of the cooling device 110 and the electronic device 120, such that the first metal layer 301 is in direct contact with the electronic device 120, and the third metal layer 303 is in direct contact with the cooling device 110.

While a limited number of configurations are shown in FIGS. 2 and 3, one having ordinary skill in the art would recognize that the present disclosure is not intended to be limiting. A number of layers may be adjusted based on need and design. Any other configuration may be applied, as long as a first region comprising a first metal is isolated from a second region comprising a second metal at or below a first temperature by an interposed layer and is in direct contact with the second region upon temperature change and phase change of the interposed layer. Each layer of the thermal interface material may have any size, shape, and thickness as needed. The thermal interface material may have configurations other than a layered structure. For example, the thermal interface material may include a first region wrapped in interposed layer and/or a second region wrapped in interposed layer.

Figure 4:
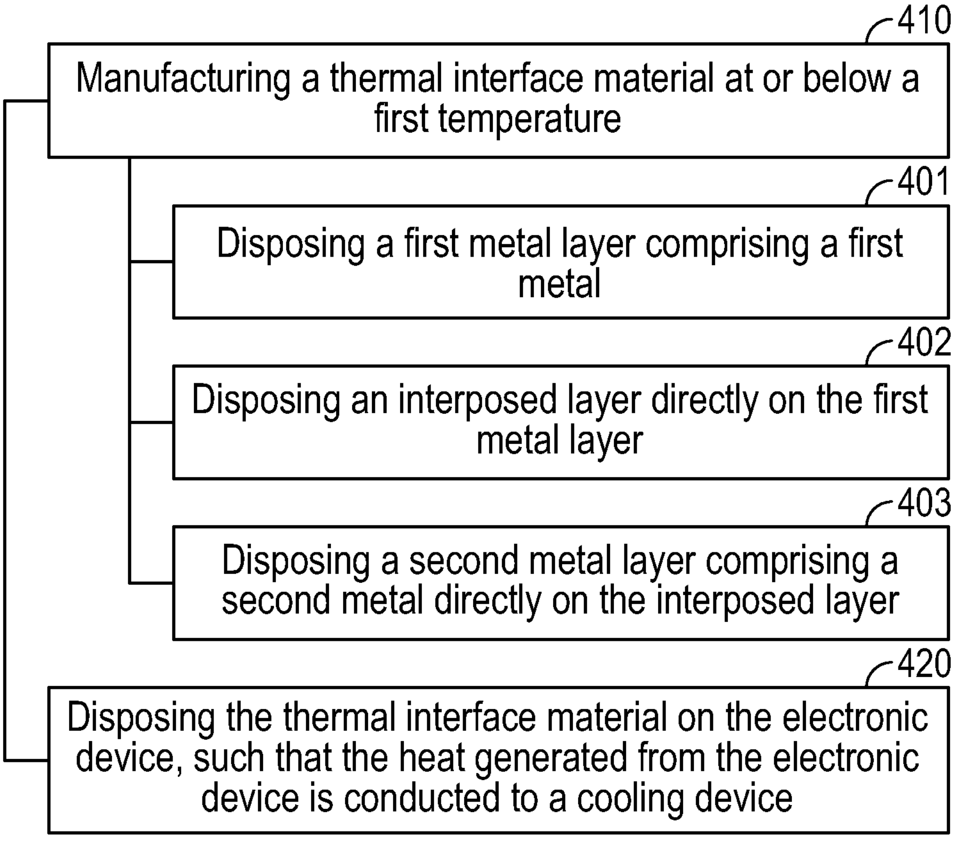
FIG. 4 shows a method in accordance with one or more embodiments of the present disclosure.

FIG. 4 shows a flowchart of a method for manufacturing a thermal interface material and conducting a heat generated from an electronic device according to one or more embodiments of the present disclosure. While the various blocks in FIG. 4 are presented and described sequentially, one of ordinary skill in the art will appreciate that some or all of the blocks may be executed in different orders, may be combined or omitted, and some or all of the blocks may be executed in parallel.

The method may include a step S410, manufacturing a thermal interface material. The thermal interface material may have configurations and compositions as previously described in accordance with other figures. The manufacturing of the thermal interface material may be performed at or below a first temperature, when components in the thermal interface material are in a solid state. The thermal interface material may be manufactured based on steps S401-S403.

The method for manufacturing may include S401, disposing a first metal layer comprising a first metal. The disposing of the first metal layer may be performed at or below a first temperature, when the first metal layer is in a solid state.

The method for manufacturing may include S402, disposing an interposed layer (or a first interposed layer) directly on the first metal layer. The disposing of the interposed layer may be performed at or below the first temperature, when the interposed layer is in a solid state.

The method for manufacturing may include S403, disposing a second metal layer comprising a second metal directly on the interposed layer. The disposing of the second metal layer may be performed at or below the first temperature, when the second metal layer is in a solid state. The first metal layer and the second metal layer are isolated by the interposed layer.

In one or more embodiments, the method for manufacturing the thermal interface material further includes disposing a second interposed layer on the second metal layer, and disposing a third metal layer comprising the first metal on the second interposed layer. The second metal layer and the third metal layer may be isolated by the second interposed layer at or below the first temperature, when the second metal layer, the third metal layer, and the second interposed layer are in solid state. The second interposed layer may have similar or same compositions and properties with the first interposed layer, and may change phase from a solid state at or below the first temperature to a phase other than the solid state at or above the second temperature, such that the second metal layer and the third metal layer contact each other and melt upon contacting.

The manufactured thermal interface material may be liquid metal based, and each of the first metal and the second metal may comprise one or more of gallium (Ga), indium (In), tin (Sn), bismuth (Bi), antimony (Sb), thallium (Tl), and lead (Pb).

The method may include step S420, disposing the thermal interface material on the electronic device, such that the heat generated form the electronic device may be conducted to a cooling device, where the heat is dissipated efficiently. The thermal interface material may be disposed directly on the electronic device and may be disposed between the electronic device and the cooling device.

In one or more embodiments, the thermal interface material is disposed on the electronic device such that the first metal layer of the thermal interface material is in direct contact with the electronic device. The second metal layer, when being an outermost layer of the thermal interface material, may be in direct contact with the cooling device. In other implementations, the third metal layer, when being the outermost layer of the thermal interface material, may be in direct contact with the cooling device.

During operation of the electronic device, the heat generated from the electronic device may cause a temperature of the thermal interface material to increase from the first temperature or less to the second temperature or more. The interposed layer(s) is configured to change phase from a solid state (at or below the first temperature) to a phase other than the solid state (at or above the second temperature). As a result, the first metal layer and the second metal layer of the thermal interface material are in direct contact with each other, and metal atoms start diffusing into each other. Upon contacting and diffusing, melting of the first metal layer and the second metal layer may occur. The second metal layer and the third metal layer may behave similarly.

The systems and methods described in one or more embodiments of the present disclosure provide a liquid metal based thermal interface material, in which the first metal and the second metal are isolated by one or more interposed layers when in solid state and melt to form liquid metal upon contacting, when the interposed layer(s) changes phase based on temperature. The systems and methods ensure ease of use and transportation by handling components of the thermal interface material when in solid state, and in-situ melting of the first metal and the second metal upon contacting when heat generated from the electronic device causes the interposed layer to change phase.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

What is claimed is:

1. A multilayer thermal interface material comprising:
a first metal layer comprising a first metal;
a second metal layer comprising a second metal; and
an interposed layer disposed between the first metal layer and the second metal layer,
wherein
the first metal layer, the second metal layer, and the interposed layer are in solid state at or below a first temperature,
the interposed layer is configured to change phase based on temperature and is in a phase other than solid state at a second temperature, such that the first metal layer and the second metal layer directly contact each other, and
upon contacting each other, the first metal in the first metal layer and the second metal in the second metal layer form an alloy that is in liquid state at or above the second temperature.

2. The thermal interface material of claim 1, further comprising:
a third metal layer comprising the first metal, wherein the second metal layer is disposed between the first metal layer and the third metal layer, and
a second interposed layer disposed between the second metal layer and the third metal layer.

3. The thermal interface material of claim 1, wherein the thermal interface material is configured to conduct heat generated by an electronic device to a cooling device, causing a temperature of the thermal interface material to increase from the first temperature or less to the second temperature or more.

4. The thermal interface material of claim 1, wherein the first metal and the second metal are each selected from a group consisting of gallium (Ga), indium (In), tin (Sn), bismuth (Bi), antimony (Sb), thallium (Tl), and lead (Pb).

5. The thermal interface material of claim 1, wherein the first metal layer comprises gallium (Ga), and the second metal layer comprises indium (In) and tin (Sn).

6. The thermal interface material of claim 1, wherein
at least one of the first metal and the second metal is in solid state at or below the second temperature.

7. The thermal interface material of claim 6, wherein the alloy is in liquid state at or above the first temperature.

8. The thermal interface material of claim 1, wherein the first temperature is in a range of 20° C. or more and 25° C. or less.

9. A computing system comprising:

an electronic device;

a cooling device; and the thermal interface material of claim 1.

10. The multilayer thermal interface material of claim 1, wherein the interposed layer is composed of an organic compound comprising one or more selected from a group consisting of fatty acids, primary and secondary alcohols, ketones, aldehydes, and esters.

11. A method for manufacturing a multilayer thermal interface material, comprising:

disposing a first metal layer comprising a first metal;

disposing an interposed layer directly on the first metal layer; and disposing a second metal layer comprising a second metal directly on the interposed layer, wherein the disposing of the first metal layer, the second metal layer, and the interposed layer are performed in a solid state at or below a first temperature, such that the first metal layer and the second metal layer are isolated by the interposed layer, the interposed layer is configured to change phase based on temperature and is in a phase other than a solid state at a second temperature, such that the first metal layer and the second metal layer contact each other, and upon contacting each other, the first metal in the first metal layer and the second metal in the second metal layer form an alloy that is in liquid state at or above the second temperature.

12. The method of claim 11, further comprises:

disposing a second interposed layer on the second metal layer, and disposing a third metal layer comprising the first metal on the second interposed layer.

13. The method of claim 11, wherein the first metal and the second metal are each selected from a group consisting of gallium (Ga), indium (In), tin (Sn), bismuth (Bi), antimony (Sb), thallium (Tl), and lead (Pb).

14. The method of claim 11, wherein the first metal layer comprises gallium (Ga), and the second metal layer comprises indium (In) and tin (Sn).

15. A method for conducting heat generated from an electronic device, comprising:

manufacturing the thermal interface material according to the method of claim 11;

disposing the thermal interface material on the electronic device, wherein the heat generated from the electronic device causes temperature of the thermal interface material to increase from the first temperature or less to the second temperature or more.

16. The method of claim 15, further comprising disposing the thermal interface material on the electronic device such that the first metal layer of the thermal interface material is in direct contact with the electronic device.

17. The method of claim 11, wherein the first temperature is in a range of 20° C. or more and 25° C. or less.

18. The method of claim 11, wherein the interposed layer is composed of an organic compound comprising one or more selected from a group consisting of fatty acids, primary and secondary alcohols, ketones, aldehydes, and esters.

* * * * *